United States Patent [19]

Havens et al.

[11] 3,792,374

[45] Feb. 12, 1974

[54] WIDEBAND MECHANICALLY AND ELECTRONICALLY TUNED NEGATIVE RESISTANCE OSCILLATOR

[75] Inventors: Richard C. Havens; James W. Taylor, both of Scottsdale, Ariz.

[73] Assignee: Motorola, Inc., Franklin Park, Ill.

[22] Filed: June 26, 1972

[21] Appl. No.: 266,334

[52] U.S. Cl. .......................... 331/107 R, 331/101

[51] Int. Cl. .......................... H03b 7/06

[58] Field of Search ....... 331/107 R, 107 G, 96, 101

[56] References Cited

UNITED STATES PATENTS

| | | | |
|---|---|---|---|
| 3,533,017 | 10/1970 | Scherer | 331/107 |
| 3,644,843 | 2/1972 | Sigmon | 331/107 G |
| 3,668,551 | 6/1972 | Kondo | 331/107 G |
| 3,688,219 | 8/1972 | Havens | 331/107 R |

OTHER PUBLICATIONS

IEEE, Transactions and Tech. Vol. MTT–18, No. 11 Nov. 1970, pgs. 799–800.

*Primary Examiner*—John Kominski
*Attorney, Agent, or Firm*—Vincent J. Rauner; Victor Myer

[57] ABSTRACT

A wideband mechanically and electrically tunable negative resistance oscillator is disclosed wherein a low Q cavity is coupled to a high Q cavity at one end thereof by a narrow gap. A negative resistance R.F. diode is disposed in the low Q cavity in good heat conducting relationship with a massive heat sink. At the other end of the high Q cavity there is the mechanical frequency adjusting structure for tuning the high Q cavity over a wide frequency range. At one side of the high Q cavity, there is a varactor diode for electrically tuning the high Q cavity over a relatively small frequency range. At the other side of the high Q cavity there is a power take out structure.

10 Claims, 2 Drawing Figures

PATENTED FEB 12 1974

3,792,374

WIDEBAND MECHANICALLY AND ELECTRONICALLY TUNED NEGATIVE RESISTANCE OSCILLATOR

BACKGROUND OF THE INVENTION

This invention relates to negative resistance microwave oscillators having wide band mechanically and electrically tunable characteristics, more particularly to such oscillators having better than heretofore, electrical performance at high frequencies, for example, in the 16 gigahertz range, and it is an object of the invention to provide improved oscillators of this nature.

Oscillators of the general nature here involved are disclosed and claimed in the copending application of Richard C. Havens, Ser. No. 84,640, filed Oct. 28, 1970, entitled Electrically and Mechanically Tunable Microwave Power Oscillator, and assigned to the same assigned as the subject application, now U.S. Pat. No. 3,688,219.

The oscillators of Havens, Ser. No. 84,640, U.S. Pat. No. 3,688,219 function well with tolerable frequency stability, heat dissipation properties and power output characteristics within the X-band to about ten GHz, or somewhat higher. These oscillators, as well as any others intended to operate in this frequency range, have cavities whose dimensions are very small. Correspondingly, the dimensions of the negative resistance diode disposed in the cavities are small. Finding room for the diodes and other components such as bimetallic frequency compensation and electronic tuning, achieving good heat transfer out of the structure to keep the operating temperature in bounds, and enabling the device to be smoothly tunable over a wide frequency range are ever present problems.

As the operating frequency is increased, for example to the Ku-band of about 12.0 to 18.0 GHz, the problems of dimensions, heat transfer, smooth tunability over wide bands, as well as others, become greater problems. Known solutions no longer meet the requirements. Accordingly, it is a further object of the invention to provide a microwave wave oscillator of the nature indicated which overcomes the indicated shortcomings of the prior art.

It is a further object of the invention to provide an improved microwave oscillator operable in the Ku-band and higher frequency bands, as well as lower, which has good heat sink properties, good power output characteristics, smooth wide-band mechanical tuning, linear electronic tuning, and efficient conversion of D.C. to R.F. and is amenable to bimetallic frequency versus temperature compensation.

BRIEF SUMMARY OF THE INVENTION

In carrying out the invention in one form, there is provided a negative resistance oscillator comprising: a first cavity resonant at a predetermined frequency, said first cavity having predetermined lateral dimensions and two end walls spaced from each other by about one-half of a wave length at said frequency; one of said end walls being movable relative to the other for tuning of said first cavity; a second cavity resonant at said frequency and having a smaller volume than said first cavity by a factor such that the resonant frequency of the combined cavities is essentially the same as that of said first cavity over a predetermined frequency range, said second cavity having a floor and a side wall extending from said floor, the terminus of said side wall defining an opening communicating with said first cavity; a negative resistance diode having two ends; means holding said diode in said second cavity with one of its ends against said floor; and a disk member connected to said diode at its other end, being disposed in said opening, and defining a narrow gap with the terminus of said side wall for transmitting R.F. power from said diode to said first cavity.

In carrying out the invention according to another form, there is provided a negative resistance oscillator comprising: a high Q cavity resonant at a predetermined frequency; a low Q cavity resonant at said predetermined frequency; said low Q cavity having a volume less than the volume of said high Q cavity by a factor such that the resonant frequency of the combined cavities is essentially the same as that of said high Q cavity over a predetermined frequency range; means for coupling said low Q cavity to said high Q cavity; and R.F. diode disposed in said low Q cavity; said coupling means comprising a narrow gap whose width is of the order of one-hundreth of a wave length at said resonant frequency.

DESCRIPTION OF THE PREFERRED EMBODIMENT

Figure 1:
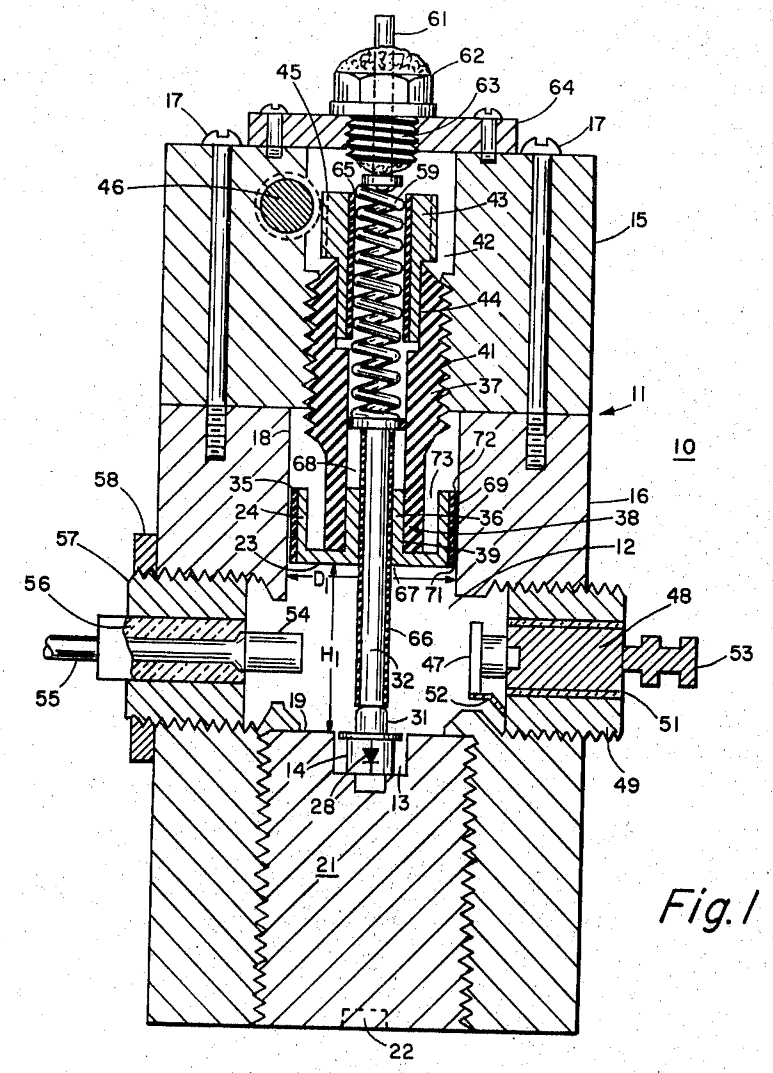
FIG. 1 is a sectional view on an enlarged scale of a microwave oscillator according to the invention.

Referring to the drawing there is shown a microwave oscillator 10 comprising a housing 11 containing a high Q cavity 12, a low Q cavity 13, and an R.F. diode 14 disposed in the cavity 13.

The housing 11 may be formed of any good heat conductive metal, copper, for example, has relatively thick walls for strength and ability to withstand high shock forces, and for convenience in manufacturing consists of two housing parts 15 and 16 attached together by means of bolts 17, for example.

The cavity 12 is essentially a cylindrical volume which may be formed by boring inwardly through bore 18, the cavity terminating with the surface 19 which is the upper surface of a metallic plug 21 threaded into the housing part 16 as shown. A slot 22, or the like, may be provided for turning the plug 21 into and out of the housing. The other end wall of the cavity 12 is the annular surface 23 forming the base portion of a U-shaped annular member, or plug, 24 which is movable into and out of the cavity 12 for adjusting the resonant frequency thereof.

The cavity 13 is formed inwardly of the surface 19, and, as shown, comprises essentially a cylindrical cavity coaxial with the cavity 12.

The resonant frequency of the high Q cavity 12 is determined, essentially, by the dimension $H_1$, the distance between the surfaces 19 and 23, at which the electric lines of force in the cavity reduce to zero, the dimension $H_1$ being equal to one-half of a wave length ($\lambda/2$) at the resonant frequency of the cavity. The diameter of the cavity 12, $D_1$, may be chosen, as is well understood by those skilled in the art, but typically would be about three-fourths or two-thirds of the half-wave length at the center frequency of the range for which the oscillator is intended to function. In one typical device made according to the invention, dimension $H_1$ was about 0.35 inch. As is also well understood in the microwave art, the cavity 12, being a high Q cavity, is very selective as to its resonant frequency and is very stable.

Figure 2:
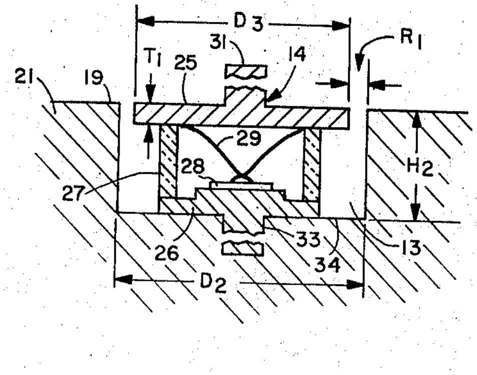
FIG. 2 is a fragmentary sectional view on a larger scale of a portion of FIG. 1.

The negative resistance R.F. diode 14, may be of the Gunn, or Impatt, varieties, for example, is disposed in the cavity 13 and has its dimensions coordinated with those of this cavity for efficient generation and transfer of power. The diode 14 is a commercial article and is obtained for functioning in the frequency range desired. In FIG. 2, R.F. diode 14 and the low Q cavity 13 together with a portion of the heat sink plug 21 are shown somewhat enlarged for convenience in directing lead lines, reference characters, etc. The diode 14 is shown as having a metallic cover 25, a metallic base 26, a cylindrical, dielectric, or insulating material, wall 27, and a diode chip 28 including leads 29 connecting the chip to the cover 25.

The cover 25 includes a prong 31 which forms one terminal of the diode 14 and is adapted to engage one end of the metallic rod 32 for bringing D.C. bias to the diode. The prong 31 can be eliminated whereby the rod 32 would engage the upper surface of the cover 25. The bottom base 26 includes a prong 23 which is received in an appropriate hole in the plug 21. The prong 33 and the base 26 are soldered, for example, to the floor 34 of the cavity 13 for efficiently removing heat from the diode during its operation. The depth of cavity 13 ($H_2$) is such as to accomodate diode 14 so that the top surface of the cover 25 is essentially in the same plane as the surface 19. The diameter $D_2$ of cavity 13 and the diameter $D_3$ of the cover 25 are such as to leave a small, or narrow gap having a radial length $R_1$ which in the typical device was 0.005 inch. The thickness $T_1$ of the cover 25 is very small being of the order of one thirty fifth of a wave length at the center frequency of the range for which the oscillator is designed and in the same typical case the dimension $T_1$ was 0.02 inch.

The thickness of the cover, or disc 25, ($T_1$) is a significant dimension in determining the resonant frequency of the cavity 13 and the contained diode. The dimension $R_1$ is a significant one with respect to the amount of power which may be efficiently transferred from the diode 28 to the main cavity 12. If this gap ($R_1$) is too large, insufficient power will be transferred and the frequency of operation will be unstable, and if it is too small in width, the power transferred will be small and the dimensions of the gap will be too hard to maintain. The function of the cavity 13, the diode contained therein and the dimension $R_1$ are such as to match the impedance of the diode 27 to that of the main cavity 12 for the efficient transfer of maximum power, and to promote stable frequency operation.

The cavity 13 is a low Q cavity, as already stated, and is not a half wave length ($\lambda/2$) cavity which would have a sharp and well-defined resonance peak. If the cavity 13 were a half wave length cavity as the cavity 12 is, it would be difficult if not impossible to have a smooth variation in resonant frequency of the combined cavities 12 and 13 when the dimensions of cavity 12 are changed, as will be described, to obtain such variations. Since the cavity 13 is a low Q cavity, it will in effect resonate with the resonant frequency of the cavity 12 over the frequency range or band of variability of cavity 12. While the cavity 13, including the diode 14 therein is designed to have a resonant frequency at the same frequency value as the cavity 12, when the two cavities are put together in the single structure, they function essentially as a single resonant cavity at the frequency of the cavity 12. This occurs principally because the volume of the cavity 13 is very small compared to the volume of the cavity 12 over the range of adjustment of cavity 12 by changing the position of annular plug 24 to change the dimension $H_1$.

The cavity 13 being small, about one-thirtieth of the volume of cavity 12, and having the packaged diode 14 disposed therein, it takes on some of the characteristics of a lumped constant circuit. At least partially for this reason the cavity 13 has the broad frequency resonance characteristic of a low Q cavity.

The cavity 12 is a high Q cavity, as indicated, such cavities being sometimes referred to as transmission line cavities in which the inductance and capicatance is distributed. It is a half wave length ($\lambda/2$) cavity and being a high Q cavity has a selective frequency response. That is the cavity has a resonant frequency which is sharp (occuring essentially at a particular frequency) and is determined by the dimensions of the cavity of which the dimension $H_1$ is adjustable to vary the resonant frequency.

Since diode 14 is a commercial article, to this extent, the cavity 13 has its dimensions chosen to accomodate those of the diode while still obtaining the dimensions of gap $R_1$ and the thickness $T_1$ to give the desired frequency and power transfer capabilities. The prongs 33 and 31 come with such commercial articles in some cases. These prongs in the one typical case were 0.062 inch in diameter and 0.062 inch in height.

In the particular case being described, the diameter $D_2$ was 0.130 inch, the diameter $D_3$ of the cover 25 was 0.120 inch, and the depth of the cavity 13 ($H_2$) was 0.045 inch.

The lower end of the cavity 12 is the surface 19 of the heat sink plug 21 and the upper surface of the cavity 12 is the annular surface 23 which is movable as will be described. The movable member, or plug, 24 is U-shaped in cross-section thereby defining an annular member in which the legs 35 and 36 are equal in length and are connected by the base member forming the surface 23. The annulus 24 is metallic and is carried on an insulating, or dielectric, sleeve like member 37 which has an extension 38 projecting into the space between the legs 35 and 36 and is cemented to the inner leg 36 at the surface 39 such as by any appropriate adhesive. The sleeve 37 has a threaded part 41 which engages corresponding threads interiorly of a bore 42 inside of the housing member 15. A metallic sleeve 43 has a reduced portion which is received within the interior of part 41 of sleeve 37 and is cemented thereto along the surface 44 by any suitable adhesive.

The sleeve 43 includes worm threads 45 for cooperation with a worm screw 46. Rotating the worm screw 46 accordingly rotates the sleeve 43, thus rotating the sleeve 41 which moves inwardly or outwardly upon the threaded part 41 thereby causing the annular adjusting member 24 to move into or out of the cavity 12 depending upon the direction of rotation. Mechanical tuning of the cavity 12 is achieved by such rotation which moves the surface 23 into the cavity 12 for increasing the resonant frequency and out of the cavity for decreasing the resonant frequency, the range of variation being about 1 to 2 GHz at the center frequency of 16 GHz without any substantial change in power output.

The resonant frequency of the cavity 12 may be also adjusted electrically by the use of a voltage variable capacity diode 47, sometimes referred to as a varactor diode, shown as a packaged diode attached to a metallic plug 48. The plug 48 is disposed inside of a threaded sleeve member 49 and separated therefrom by dielectric sheath 51. The threaded sleeve member 49 may be turned into and out of a threaded hole in the wall of housing part 16 for moving the flange portion of the casing of diode 47 into and out of the cavity 12. The flange portion of diode 47 is connected by a conductor 52 to the sleeve 49 for grounding purposes. The plug 48 includes an extension or terminal 53 to which a conductor or lead may be attached for bringing voltage to the diode 47.

The capacity value of varactor diode 47 may be changed by changing the voltage applied thereto through the terminal 53. This variable capacity is coupled to the oscillations inside the chamber 12 since a loop comprising the conductive ribbon 52 is coupled to the magnetic lines of force in the chamber 12. The rotation of the plug 49 therefor varies the coupling between the varactor diode 47 and the magnetic lines of force in the cavity 12 both by angular position of the ribbon 52 and the magnetic lines of force and by bringing the ribbon 52 closer to or further away from the magnetic lines of force in the cavity 12. Hence, the amount of frequency change obtained per volt of voltage applied to the diode 47 can be adjusted by proper positioning of the diode in the cavity 12. Furthermore, as the plug 49 is threaded into the member 16, the losses in the diode 47 are increased since more energy is picked up by the ribbon 52. The tuning of cavity 12 may be changed by about 15 MHz by use of the varactor with relatively little power loss.

Power is removed from, or taken out, of the cavity 12 by means of a probe 54 which is the terminal of a conductor 55 extending through a dielectric annular member 56 disposed inside of a metallic sleeve 57. The sleeve 57 is threaded as shown so that turning of the sleeve 57 places the probe 54 farther into or out of the cavity 12 as may be desired. A clamping nut 58 is provided for holding the sleeve 57 and the conductor 55 in the position desired. While the probe 54 is shown essentially midway between the surface 19 and 23 for maximum power output, this may be altered if desired to satisfy particular conditions.

D.C. bias is brought in through the center conducting rod 32, the outer end of which is engaged by a spiral spring 59 which in turn engages the inner end of bias terminal 61 to which D.C. may be connected. The spring 59 urges the end of rod 32 into contact with the diode prong 31. The terminal 61 passes through and is insulated from the housing 15 casing by bias filter 62 which may be turned into and out of the casing by means of threads 63 in the cap 64. The bias filter enables D.C. bias to be supplied and, at the same time, provides additional higher frequency choke to the microwave energy in the oscillator cavity.

The metallic sleeve 43 includes an insulating layer 65 which may be a thin layer of dielectric material such as Teflon. The thickness of the material is shown much greater than it is in actual fact. The insulating layer 65 is to prevent the coils of the spring 59 from engaging the metallic sleeve 43 to avoid short circuiting the D.C. bias.

The D.C. bias brought in at terminal 61 is sufficient in magnitude to break down the diode 14, causing a negative resistance to appear in cavity 13. Hence oscillations whose frequency is determined by the resonant structure of the cavity 13 appear in cavity 13 and by virtue of the gap $R_1$ oscillations are excited in, or coupled to, the cavity 12. The oscillations continue at the resonant frequency of cavity 12.

Microwave energy existing in the cavity 12 is prevented from coming out at the inner and outer diameters of the annular plug 24 by providing appropriate one-quarter wave length transmission lines, so to speak, to seal off the possible gaps. The conducting rod 32 has a layer of dielectric material such as Teflon 66 surrounding its surface from one end to the other. The dielectric layer 66, whatever air exists throughout the space between the inner leg 36 of the annular plug 24 and the rod 32, the leg 36, and the rod 32 from a quarter wave length transmission line which provides a short circuit for R.F. energy at the circular gap 67 and an open circuit, or high impedance, at the circular gap 68. Similarly the outer leg 35 of annular plug 24 has a dielectric layer 69, such as Teflon, disposed around its exterior surface as shown. The dielectric layer 69, whatever air exists throughout the space between the outer leg 35 and the surface of bore 18, the leg 35 and the surface of bore 18 form a quarter wave length transmission line which provides an R.F. short circuit at the circular gap 71 and an R.F. open circuit at the other end 72. The end 38 of dielectric sleeve 37 projecting into the annular plug 24, the annular air gap in the vicinity of the extension 38, and the inner surfaces of the leg 35 form a quarter wave length transmission line which is short circuited at the base member having surface 23, and is open circuited at the end 73. The combination of the three one-quarter wave length transmission lines as described prevents the escape of any microwave energy along the gaps between the surfaces of annular plug 24 and the rod 32 and the surface of bore 18. These gaps exist because of the need for plug 24 to move for producing frequency adjustment.

The plug 48 the dielectric sheath 51 and the sleeve 49 also form a one-quarter wave length transmission line presenting a short circuit at the inner end of the dielectric sheath 51 and an open circuit at the outer end thereof. Accordingly, there is no microwave energy transmitted out through the dielectric sheath 51. The power output probe 54 together with the conductor 55, the insulating or dielectric sleeve 56 and the conducting plug 57 form a coaxial transmission line conductor for removing microwave energy. The dimensions of the probe 54 are such that the probe optimally couples out the available microwave energy in the cavity 12 into the 50 ohm characteristic impedance transmission line made up of 56, 55, and 57.

It will be understood that instead of the probe 54 being used for taking microwave energy out of the cavity 12 by coupling to the electric field, a loop may be used for coupling to the magnetic field within the cavity.

Placing the diode 14 within the cavity 13 removes the diode from the cavity 12 and thus makes space available for other components, if desired, in an area where the space or volume available is already at a high premium. The cavity 13 through the annular gap $R_1$ efficiently couples the diode 14 (28) to the cavity 12 and thus makes for maximum transmission of R.F. energy from the diode to the cavity 12 and thus to the output conductor 55 over a wide frequency range.

The diode 14 being soldered to the floor of cavity 13 is in good heat conductive relation to the relatively massive heat sink plug 21. At the same time, the mechanical frequency changing structure is at the opposite end of the heat sink. Thus the heat sink capabilities of the oscillator are not interfered with by the frequency adjusting structure.

We claim:

1. A negative resistance oscillator comprising:
- a first cavity resonant at a predetermined frequency, said first cavity having predetermined lateral dimensions and two end walls spaced from each other by essentially one-half of a wave length at said frequency;
- one of said end walls being movable relative to the other for tuning of said first cavity;
- a second cavity disposed in said other end wall and having a floor and a side wall extending from said floor, the terminus of said side wall defining an opening communicating with said first cavity at said other end wall;
- a negative resistance diode having two ends and being disposed in said second cavity;
- means holding said diode in said second cavity with one of its ends against said floor; and
- a disk member connected to said diode at its other end, being disposed in said opening substantially planar with said other end wall, and defining a narrow gap with the terminus of said side wall for transmitting R.F. power from said diode to said first cavity;
- said second cavity having a volume smaller than said first cavity by a factor such that in combination with said diode in said second cavity the resonant frequency of the combined cavities is essentially the same as that of said first cavity over a predetermined frequency range;
- said second cavity and said diode therein comprising essentially a lumped constant circuit.

2. The negative resistance oscillator according to claim 1 wherein said first cavity includes a further opening between said end walls, and an electrical means is mounted in said further opening for tuning said first cavity.

3. The negative resistance oscillator according to claim 2 wherein said electrical means comprises a voltage sensitive capacity diode.

4. The negative resistance oscillator according to claim 1 wherein said first cavity includes another opening between said end walls, and a power output member mounted in said other opening and extending into said first chamber.

5. The negative resistance oscillator according to claim 1 including means comprising a conducting member extending centrally through said movable wall for providing D.C. bias to said diode.

6. A negative resistance oscillator comprising:
- a first cavity resonant at a predetermined frequency, said first cavity having predetermined lateral dimensions and two end walls spaced from each other by essentially one-half wave length at said frequency,
- one of said end walls being movable relative to the other for tuning of said first cavity;
- a second cavity disposed in said other end wall and having a floor and side walls extending from said floor, the terminus of said side wall defining an opening communicating with said first cavity;
- a metallic cover for said opening, said cover having an edge defining a narrow gap with the terminus of said side wall for transmitting R.F. power from said second cavity to said first cavity;
- a negative resistance diode for generating R.F. power disposed in said second cavity, said diode having two ends;
- means holding one of the ends of said diode against said floor; and
- means connecting the other end of said diode to said cover;
- said second cavity having a volume smaller than said first cavity by a factor such that in combination with said diode in said second cavity the resonant frequency of the combined cavities is essentially the same as that of said first cavity over a predetermined frequency range;
- said second cavity and said diode therein comprising essentially a lumped constant circuit.

7. The negative resistance oscillator according to claim 6 wherein said second chamber is a circular chamber, and said cover is a circular disk whose thickness is less than a wave length by a factor of about one-twentieth of a wave length at said predetermined frequency.

8. The negative resistance oscillator according to claim 7 wherein said diode includes a casing having an enlarged circular disk at one end, and said enlarged circular disk comprises the cover of said second cavity.

9. The negative resistance oscillator according to claim 8 wherein the first cavity and second cavity are axially disposed relative to each other.

10. A negative resistance oscillator comprising:
- a first cavity resonant at a predetermined frequency, said first cavity having predetermined lateral dimensions and two end walls spaced from each other by essentially one-half wave length at said frequency;
- one of said end walls being movable relative to the other for tuning of said first cavity;
- a second cavity disposed in said other end wall and having a floor and side walls extending from said floor, the terminus of said side wall defining an opening communicating with said first cavity;
- a metallic cover for said opening, said cover having an edge defining a narrow gap with the terminus of said side wall for transmitting R.F. power from said second chamber to said first cavity;
- a negative resistance diode for generating R.F. power disposed in said second cavity, said diode having two ends;
- means holding one of the ends of said diode against said floor; and
- means connecting the other end of said diode to said cover;
- said second cavity having a volume smaller than said first cavity by a factor such that in combination with said diode in said second cavity the resonant frequency of the combined cavities is essentially the same as that of said first cavity over a predetermined frequency range;
- said second cavity and said diode therein comprising essentially a lumped constant circuit;
- means in said first cavity for electrically adjusting the resonant frequency thereof; and
- means for taking R.F. power out of said first cavity.

* * * * *